(12) United States Patent
Ogawa et al.

(10) Patent No.: US 8,823,309 B2
(45) Date of Patent: Sep. 2, 2014

(54) STAGE DEVICE

(75) Inventors: Hironori Ogawa, Hitachinaka (JP);
Masahiro Koyama, Tsuchiura (JP);
Nobuo Shibata, Kasumigaura (JP);
Masaru Matsushima, Hitachinaka (JP);
Shuichi Nakagawa, Hitachinaka (JP);
Katsunori Onuki, Hitachi (JP);
Yoshimasa Fukushima, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 240 days.

(21) Appl. No.: 13/391,962

(22) PCT Filed: Sep. 17, 2010

(86) PCT No.: PCT/JP2010/066129
§ 371 (c)(1),
(2), (4) Date: Feb. 23, 2012

(87) PCT Pub. No.: WO2011/034158
PCT Pub. Date: Mar. 24, 2011

(65) Prior Publication Data
US 2012/0145920 A1 Jun. 14, 2012

(30) Foreign Application Priority Data

Sep. 18, 2009 (JP) ................................. 2009-217641

(51) Int. Cl.
*G03B 27/42* (2006.01)
*H01L 21/027* (2006.01)

(52) U.S. Cl.
USPC .................. 318/649; 378/34; 355/53; 355/72

(58) Field of Classification Search
CPC ............ G03F 7/70716; G03F 7/70725; G03F 7/70991

USPC ...................... 250/492.2, 442.11; 355/53, 72; 318/649, 560; 310/12.01, 12.29
See application file for complete search history.

(56) References Cited

U.S. PATENT DOCUMENTS

| 4,766,465 | A * | 8/1988 | Takahashi ....................... 355/53 |
| 6,917,046 | B2 * | 7/2005 | Korenaga .................. 250/492.2 |
| 6,943,945 | B2 * | 9/2005 | Nakagawa et al. ........... 359/393 |

(Continued)

FOREIGN PATENT DOCUMENTS

| JP | 61-54143 A | 3/1986 |
| JP | 2002-93686 A | 3/2002 |

(Continued)

OTHER PUBLICATIONS

PCT/ISA/237 Form (Three (3) pages).

(Continued)

*Primary Examiner* — Nikita Wells
*Assistant Examiner* — Johnnie L Smith
(74) *Attorney, Agent, or Firm* — Crowell & Moring LLP

(57) ABSTRACT

Disclosed is a smaller and lighter stage device which can be applied to a device such as a length measurement SEM for inspecting and/or evaluating a semiconductor, and in which the effect of a magnetic field on an electron beam can be reduced. Linear motors 110, 111, 112, 113 are disposed on four sides of a base 104 to be distanced from an electron beam projection position (the center of the stage device), respectively. The base 104 has dimensions substantially equivalent to minimum dimensions determined by the size of a top table 101 and a movable stroke. Linear motor stators 110, 112 are configured to have a "C-shaped" structure whose opening faces outside of the stage device, respectively. Further, a movable table is coupled to the top table via linear guides 107, 109 composed of a nonmagnetic material or roller mechanisms composed of a nonmagnetic material.

10 Claims, 9 Drawing Sheets

(56) References Cited

U.S. PATENT DOCUMENTS

| | | | | |
|---|---|---|---|---|
| 7,557,529 | B2* | 7/2009 | Tanaka | 318/649 |
| 7,898,204 | B2* | 3/2011 | Hunter | 318/568.11 |
| 8,325,326 | B2* | 12/2012 | Shibazaki | 355/72 |

FOREIGN PATENT DOCUMENTS

| | | |
|---|---|---|
| JP | 2003-123680 A | 4/2003 |
| JP | 2004-95855 A | 3/2004 |
| JP | 2004-317758 A | 11/2004 |
| JP | 2007-188975 A | 7/2007 |
| WO | WO 2006/075575 A1 | 7/2006 |

OTHER PUBLICATIONS

International Search Report including English translation dated Nov. 9, 2010 (Two (2) pages).

Japanese-language Office Action dated Sep. 3, 2013 (two (2) pages).

\* cited by examiner (a)

(b)

STAGE DEVICE

TECHNICAL FIELD

The present invention relates to a stage device, for example, to a stage device suitable as a sample stage of an electron microscope device which is used to inspect and/or evaluate a semiconductor in the semiconductor manufacturing field.

BACKGROUND ART

Recently, semiconductor devices have decreased in size, and this situation has required semiconductor manufacturing apparatuses as well as inspection and/or evaluation apparatuses to have higher precision correspondingly. Generally, in order to evaluate whether a shape and/or dimensions of a pattern formed on a semiconductor wafer are accurate or not, a scanning electron microscope having a length measurement function (hereinafter, called a length measurement SEM) is used.

The length measurement SEM irradiates, with an electron beam, a wafer on which a pattern is formed, manipulates a secondary electron signal obtained from the projection for image processing, and derives a dimension by finding out an edge of the pattern from signal's light-dark transition. Then, in order to correspond to a decrease in size of a semiconductor device described above, it is important to obtain a secondary electron image having a less amount of noise in a higher observation magnification. For the purpose, it is necessary to improve contrast by superposing many secondary electron images on one another, and a sample stage for mounting and holding a wafer is required to be quite precisely positioned in the micron order.

Further, the travel time of a sample stage has a large effect on the throughput of an entire device. Particularly, in the case of a sample stage which transports a large semiconductor wafer, the travel time of the sample stage is required to be reduced for improving the throughput.

On the one hand, a larger and/or heavier stage device increases the mass of a sample chamber which houses the stage device, and also increases costs of a mount for holding the sample chamber and setting of the mount. Therefore, the stage device has to be smaller and lighter.

As described above, the stage device is required to have capability of a high precision and high speed positioning, and simultaneously to be smaller and lighter. For the purpose, a servo control system is commonly employed which includes a drive mechanism such as a linear motor. However, in the case where the stage device with a linear motor is applied to a length measurement SEM, an electron beam is deflected by a magnetic field generated from a primary side formed of a coil and a secondary side formed of a permanent magnet of the linear motor, and a secondary electron image may accordingly be adversely affected. The length measurement SEM moves a stage to a measurement point on a semiconductor wafer, and subsequently acquires an image using an electron beam. For the purpose, the length measurement SEM can eliminate a magnetic field generated from a primary side by suspending power supplying to a coil after positioning the stage. However, because a secondary side uses a permanent magnet, a magnetic field cannot be completely eliminated. Accordingly, it is necessary to design in consideration of the effect on a secondary electron image to be acquired using the electron beam.

As described above, the magnet fields which may adversely affect the electron beam are roughly classified into two types. One of the two types is called a fixed magnetic field having the absolute amount of the magnetic field at an electron beam projection position. The other is a varying magnetic field in which a magnetic field at the electron beam projection position varies when the stage is moved. Since the fixed magnetic field does not vary independently of the movement of the stage, its effect can be eliminated to a certain extent by compensating for deflection of an electron beam, which compensation is performed, for example, based on a distribution map of the fixed magnetic field acquired in advance. However, if the absolute amount of the magnetic field is large, it may be thought that the compensation by the deflection of the electron beam cannot be sufficient. Accordingly, the fixed magnetic field has to be decreased in amplitude. Further, since the varying magnetic field varies when the stage is moved, the compensation cannot be executed in advance. Accordingly, it is necessary to control the variation in magnetic field when the stage is moved.

Generally, there is a system configured for providing a stage device which operates in the X-Y plane, the system including a linear motor and a linear guide disposed in the direction of one axis (here, called an upper axis) on a table which moves in the direction of the other axis (here, called a lower axis), and a top table disposed on a linear motor mover in the upper axis. According to this system, because permanent magnets of the linear motor in the upper axis moves together with the table in the lower axis, the variation in magnetic field at an electron beam projection position is very large.

As measures against the fixed magnetic field and the varying magnetic field which affect the electron beam as described above, the technology has been described in Patent Literature 1 which reduces the effect of the magnetic fields by distancing the magnetic fields from the electron beam projection position using four linear motors. In this technology, a movable table is configured to intersect with the X-direction and the Y-direction, and to operate in the X-Y plane by disposing linear motors on both ends of the movable table from the outside. Further, as another technology, the technology has been described in Patent Literature 2 which eliminates the effect of the magnetic fields on the electron beam by disposing linear motors outside of a sample chamber.

CITATION LIST

Patent Literature

Patent Literature 1: JP 2002-93686A
Patent Literature 2: JP 2003-123680A

SUMMARY OF INVENTION

Technical Problem

However, according to the technology described in Patent Literature 1, because the motors are disposed outside of the movable area of the top table, it is difficult to downsize the device. Further, the electron beam is affected by a leakage magnetic field through an opening of a linear motor stator, leading to the problem that the secondary electron image is disturbed.

Further, according to the technology described in Patent Literature 2, because the motors are disposed outside of the sample chamber, it is difficult to downsize the device, and its configuration becomes complicated, thus resulting in a higher cost.

The present invention is intended to solve the problems described above. An object of the invention is to provide a stage device which can be applied to a device such as a length measurement SEM for inspecting and/or evaluating a semiconductor, and which has a smaller and lighter structure and can reduce the effect of a magnetic field on an electron beam.

Solution to Problem

According to the present invention, linear motors are disposed on four sides of a base to be distanced from an electron beam projection position (the center of the stage device), the base having dimensions substantially equivalent to minimum dimensions determined by the size of a top table and a movable stroke. Linear motor stators are configured to have a "C-shaped" structure whose opening faces upward or outside of the device. When coupling a movable table to the top table, a linear guide composed of a nonmagnetic material or a roller mechanism composed of a nonmagnetic material may be configured to transmit a displacement.

Also, instead of using a magnetic material on the movable table, use of the nonmagnetic linear guide or roller mechanism can eliminate the variation in magnetic field generated due to movement of a magnetic body when the table moves.

Advantageous Effects of Invention

According to the present invention, the size of the stage device can be minimized. Also, the effect of the fixed magnetic field on the electron beam can be minimized because the fixed magnetic field which leaks from the linear motor stators is distanced from the electron beam projection position and magnetic flux faces outside.

DESCRIPTION OF EMBODIMENTS

A stage device according to the present invention will be described hereinafter in detail with reference to the drawings.

Figure 1:
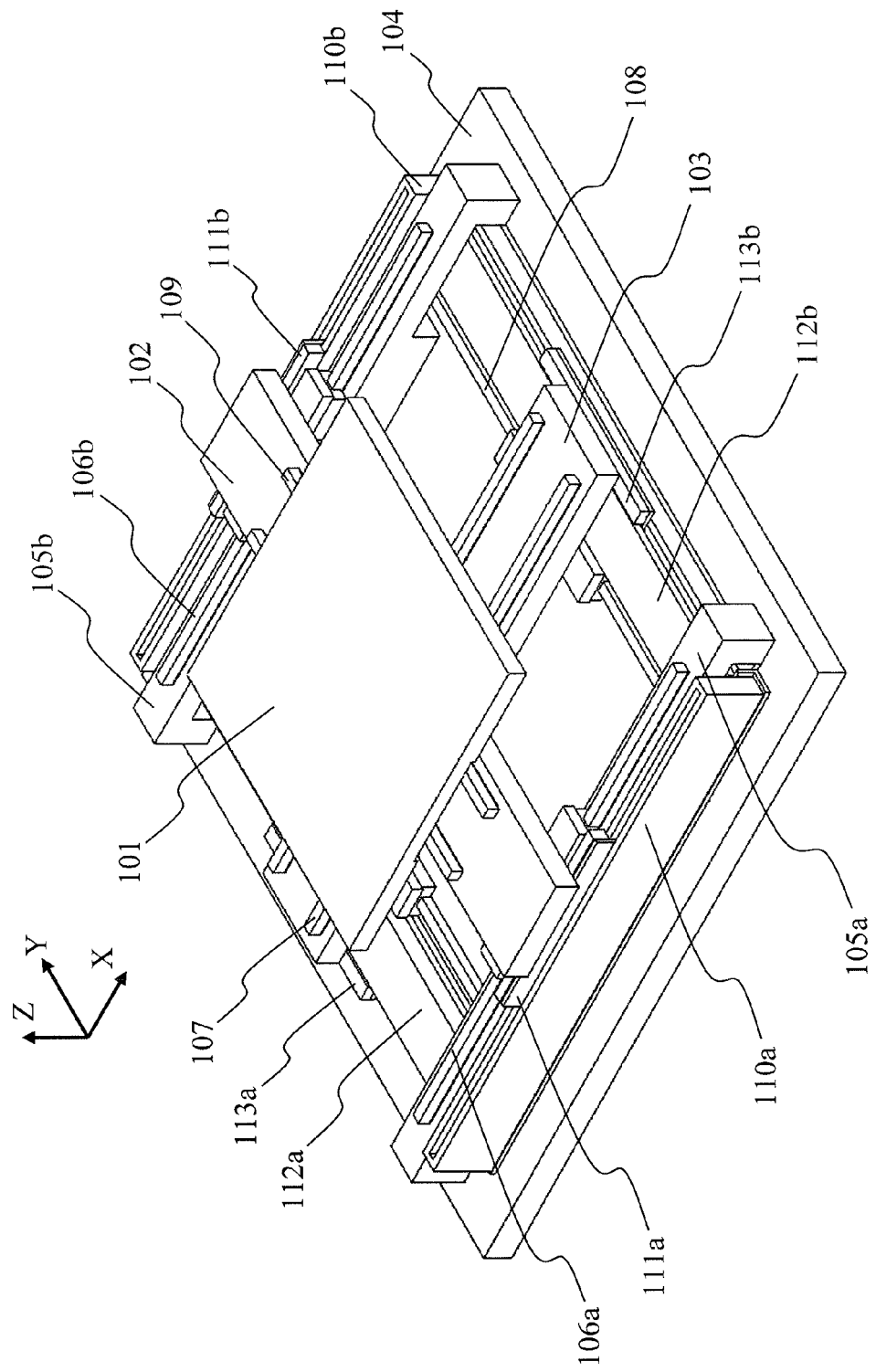
FIG. 1 is an outline sketch drawing illustrating one example of a stage device according to the present invention.
Figure 2:
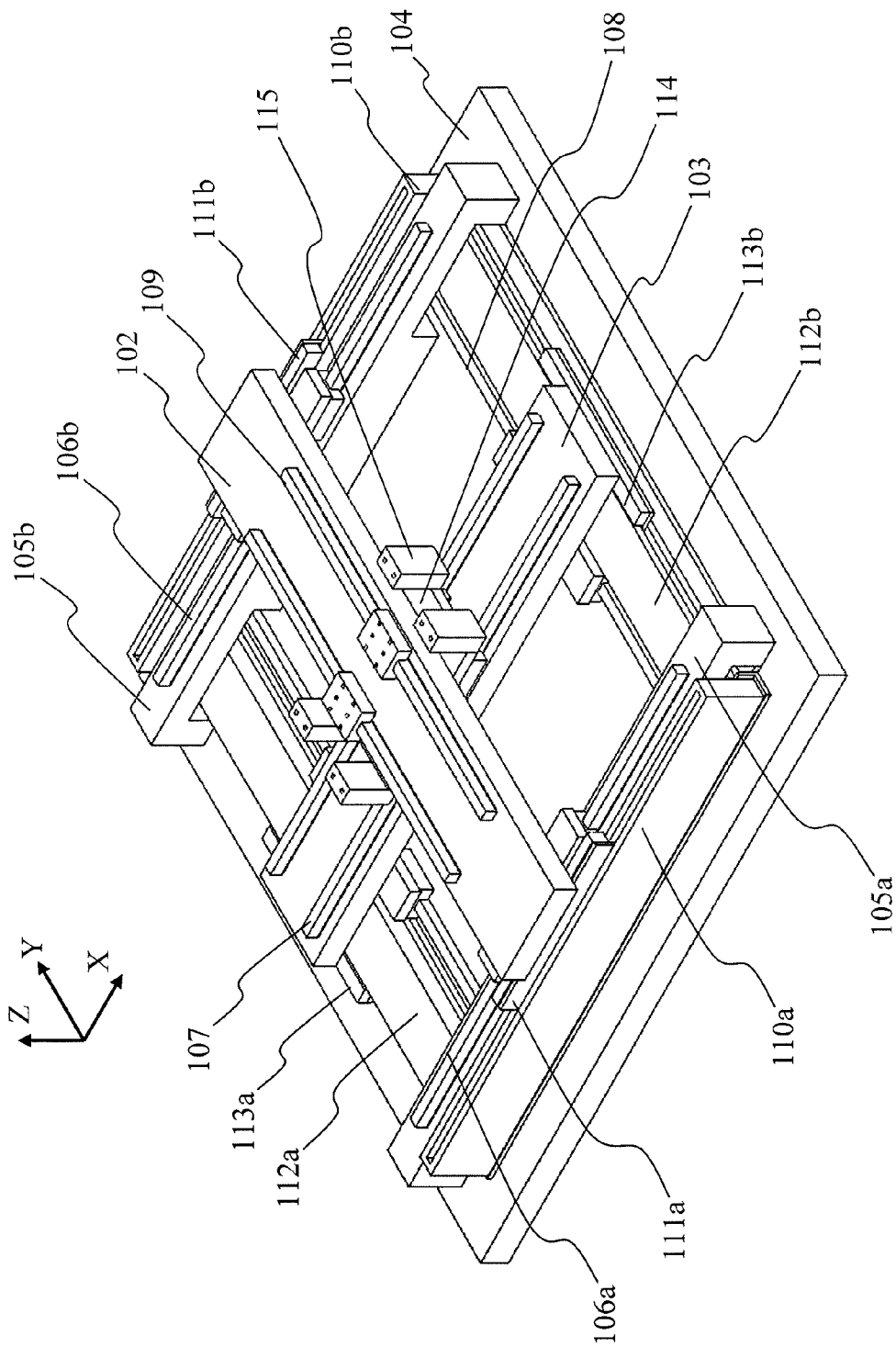
FIG. 2 is a sketch drawing of the stage device with a top table being removed.

FIG. 1 is an outline sketch drawing illustrating a stage device according to a first embodiment of the present invention. FIG. 2 is a sketch drawing with a top table being removed from FIG. 1.

Referring to FIG. 1, a stage mechanism includes a movable table mounted on a base 104 and a mechanism for driving the movable table. First, a Y-table 103 is constrained by a Y-guide 108 fixed on the base 104 and is installed so as to be movable only in the Y-direction (the Y-direction in the coordinate system shown in FIG. 1). Y-motor movers 113a, 113b are fixed in the vicinity of both ends of the Y-table 103, respectively. Y-motor stators 112a, 112b have "C-shaped" cross-sections in the X-Z plane whose openings face outside of the base 104, and are installed so as to grasp the Y-motor movers 113a, 113b by both sides of the Y-motor movers in the Z-axis (the Z-direction in the coordinate system shown in FIG. 1). Here, a linear motor includes a primary side (permanent magnet) and a secondary side (coil), and desirably, the Y-motors include permanent magnets as the stators 112a, 112b, respectively, and a coil as the movers 113a, 113b, respectively. The Y-table 103 is driven in the Y-direction by electromagnetic forces generated between the Y-motor stators 112a, 112b and the Y-motor movers 113a, 113b, respectively.

Figure 3:
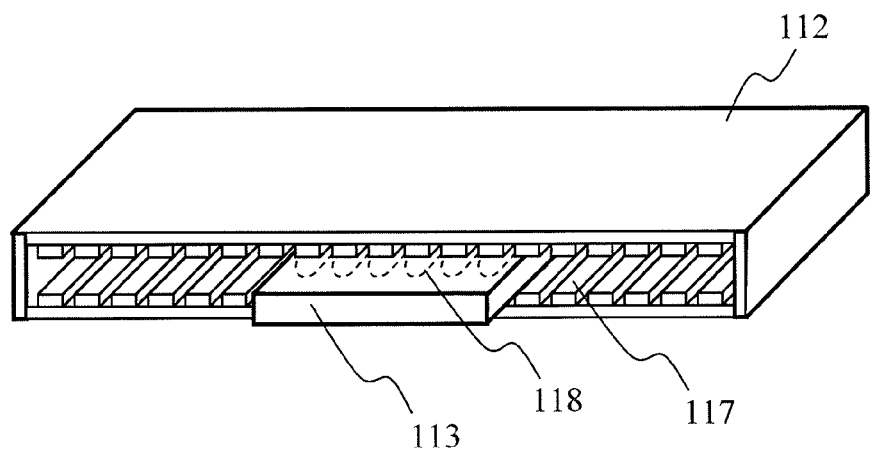
FIGS. 3a and 3b are schematic views of a linear motor.
Figure 3:
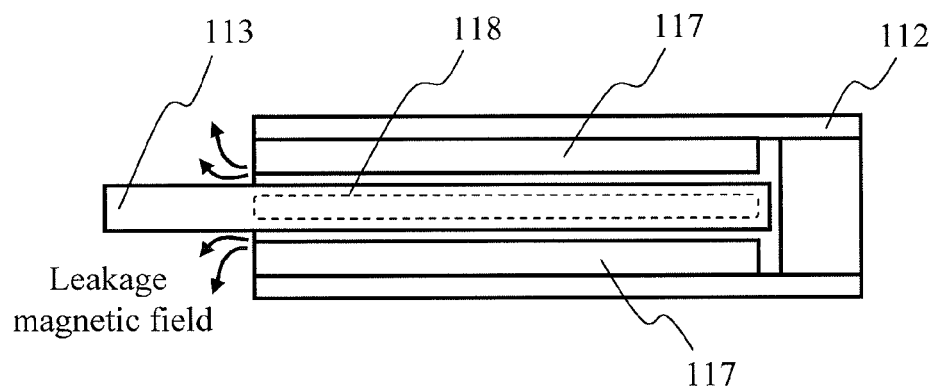

FIG. 3 is a schematic view of the linear motor including the Y-motor stator and the Y-motor mover, and FIG. 3a is an outline sketch drawing, and FIG. 3b is a cross-section view in the X-Z plane. The stator 112 includes a boxy yoke one side of which is open and whose opening faces outside of the base. On inner wall surfaces opposed to each other in the yoke of the stator 112, many permanent magnets 117 are disposed, and the mover 113 having the coil 118 is movably disposed between groups of the permanent magnets opposed to each other. As shown in FIG. 3b, the yoke of the stator 112 has the C-shaped cross-section. Further, through the opening of the yoke facing outside of the base, a magnetic field leaks to a certain extent.

Returning to FIG. 1, X-guide racks 105a, 105b are fixed on the base 104, an X-table 102 is constrained by X-guides 106a, 106b fixed on the X-guide racks 105a, 105b, and is installed so as to be movable only in the X-direction (the X-direction in the coordinate system shown). X-motor movers 111a, 111b are fixed in the vicinity of both ends of the X-table 102, respectively. X-motor stators 110a, 110b have "C-shaped" cross-sections in the Y-Z plane whose openings face upward in the Z-direction, and are installed so as to grasp the X-motor movers 111a, 111b by both sides of the X-motor movers in the Y-direction. Similarly to the Y-motors, the X-motors include, desirably, permanent magnets as the stators 110a, 110b, respectively and a coil as the movers 111a, 111b, respectively. The X-table 102 is driven in the X-direction by electromagnetic forces generated between the X-motor stators 110a, 110b and the X-motor movers 111a, 111b, respectively.

As described above, the X-table 102 and the Y-table 103 are configured to cross each other, and to be driven independent of one another in the X-direction and in the Y-direction with respect to the base 104, respectively. In doing so, the height of the X-table 102 in the Z-direction is provided larger than the height of the Y-table 103 in the Z-direction so that the X-table and the Y-table can operate without interference with each other.

On the Y-table 103, an X-sub guide 107 is disposed in parallel with the X-axis. As shown in FIG. 2, a sub table 114 is installed so as to be movable along the X-sub guide 107 only in the X-direction with respect to the Y-table 103. Accordingly, the sub table 114 moves together with the Y-table 103 in the Y-direction, and moves along the X-sub guide 107 in the X-direction, so that the sub table 114 can operate in two dimensions in the X-Y plane.

On the X-table 102, a Y-sub guide 109 is provided in parallel with the Y-axis. A top table 101 is installed so as to be movable along the Y-sub guide 109 only in the Y-direction with respect to the X-table 102. Accordingly, the top table 101 moves together with the X-table 102 in the X-direction, and moves along the Y-sub guide 109 in the Y-direction, so that the top table 101 can operate in two dimensions in the X-Y plane. The top table 101 is fixed to the sub table 114 via a coupling member 115 and operates as a unit in two dimensions in the X-Y plane.

According to the configuration described above, when the X-motors (110a, 111a and 110b, 111b) drive the X-table 102 in the X-direction, then the X-table 102, the top table 101 and the sub table 114 move as a unit in the X-direction. Similarly, when the Y-motors (112a, 113a and 112b, 113b) drive the Y-table 103 in the Y-direction, then the Y-table 103, the sub table 114 and the top table 101 move as a unit in the Y-direction. These movements of the top table 101 in the X-direction and in the Y-direction can be performed independently of each other. That is, by controlling the X-motors and the Y-motors, the top table 101 can be moved to any positions in the X-Y plane to be positioned.

Figure 4:
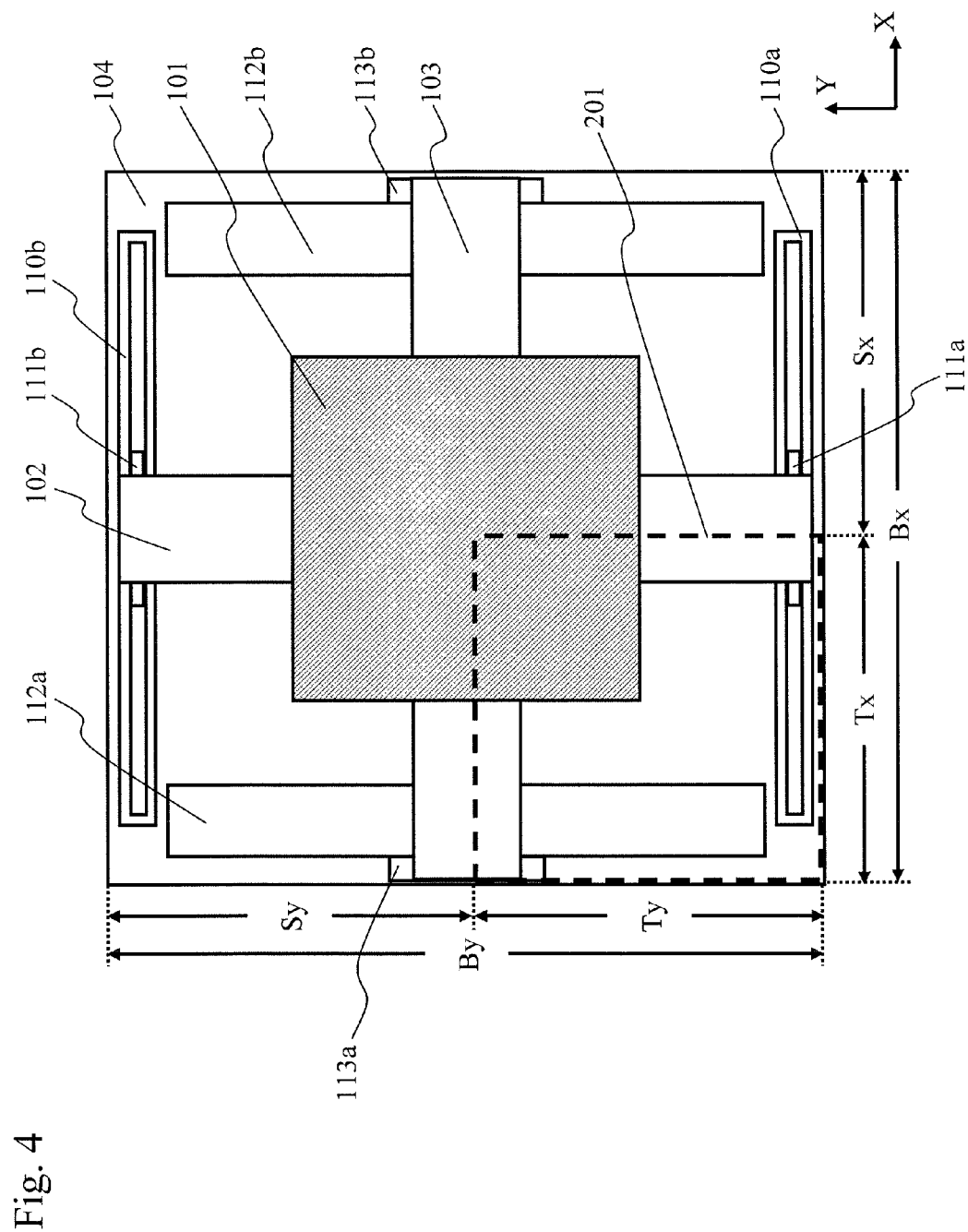
FIG. 4 is a schematic block diagram illustrating one example of a stage mechanism according to the present invention.

FIG. 4 roughly illustrates a configuration of the stage device shown in FIG. 1, seen from above the top table. In FIG. 4, only main components are shown for simplicity of description. Hereinafter, advantages of the present invention will be described with reference to FIG. 4. In FIG. 4, broken lines 201 show a position where the top table 101 in the stage device according to this embodiment moves to respective stroke ends on the minus sides in the X-direction and in the Y-direction shown.

In FIG. 4, the length $T_X$ of the top table 101 in the X-direction is generally determined depending on the size of a sample to be transported. For example, in a semiconductor inspection device, the length may be determined based on the size of a semiconductor wafer. Further, a movable range (X-stroke) of the top table 101 in the X-direction can be arbitrarily determined. In a semiconductor inspection device, the X-stroke may take a length equal to or larger than the diameter of a semiconductor wafer so that the whole surface of the semiconductor wafer can be observed. Then, in order that the top table 101 may travel the whole length of the X-stroke in the X-direction, the necessary length $B_X$ is the sum of the length $T_X$ of the top table and the X-stroke $S_X$. For the Y-direction, quite similarly, the length $T_Y$ of the top table 101 in the Y-direction and the Y-stroke $S_Y$ are determined. In order that the top table 101 may travel the whole length of the Y-stroke in the Y-direction, the necessary length $B_Y$ is the sum of the length $T_Y$ of the top table and the Y-stroke $S_Y$. Accordingly, in order that the top table 101 may travel full strokes in the X-Y plane, the necessary space is formed so as to have the lengths of $B_X$ and $B_Y$.

Because a larger base 104 increases the size and mass of the device, it is desirable to design using a minimal size. That is, the base 104 is configured to have the length $B_X$ in the X-direction and the length $B_Y$ in the Y-direction, so that the smallest and lightest device can be realized with the operating space being secured.

On the one hand, an electron beam is projected from above the center of the device, and it is necessary to minimize the effect of a magnetic field on the electron beam. Because the permanent magnets in the linear motors especially have a strong magnetic force, the motors are desirably installed so as to be distanced from an electron beam projection position as far as possible so as to reduce the effect of the magnetic field.

Accordingly, as shown in FIG. 4, the base 104 is configured to have lengths equivalent to the length $B_X$ in the X-direction and the length $B_Y$ in the Y-direction, and the linear motor stators 110a, 110b and 112a, 112b are configured to be disposed along four sides of the base, and to be distanced from the center of the base as far as possible. According to this configuration, the effect of the fixed magnetic field can be removed to the maximum with the size of the base 104 being minimized. Further, according to this embodiment, the Y-motors (112a, 113a and 112b, 113b) are disposed sideways, so that the height of the Y-table 103 can be decreased, thus resulting in a decrease in height of the whole stage device. Accordingly, the stage device can decrease in mass.

Further, it is effective in further controlling the effect of the magnetic field to cover a surrounding area of the permanent magnets in the linear motor stators 110a, 110b and 112a, 112b with a magnetic shielding material. However, in the stators having the "C-shaped" structure, the movers move with the openings of the stators grasping the movers, and it is thus difficult to attach a magnetic shielding material to the open sides of the "C-shaped" stators, and a leakage magnetic field through the openings therefore cannot be negligible. In this embodiment, especially, the Y-motor stators 112a, 112b can be configured so that the openings thereof face outside, and accordingly the direction of the leakage magnetic flux through the openings can be directed outside, and simultaneously a position from which the magnetic field leaks can be distanced further away from the electron beam. Moreover, the stage device according to the present invention is housed in a vacuum chamber called a sample chamber. Then, the openings of the motor stators are configured to face outside and to be disposed near the inner wall surfaces of the sample chamber, and accordingly it is effective in further controlling the effect of the fixed magnetic field to apply a magnetic shielding material on inner wall surfaces of the sample chamber.

Further, in FIG. 1, the Y-sub guide 109 on the X-table 102 and the X-sub guide 107 on the Y-table 103 move in the X-direction and in the Y-direction, together with planar movement of the top table 101 in the X-Y plane. If the linear guide is composed of a magnetic material such as an iron-based material, especially when a magnetic body passes by the electron beam projection position, then the amplitude and direction of the magnetic flux at the electron beam projection position are changed depending on a position of the magnetic body, thus affecting the secondary electron image. Accordingly, the Y-sub guide 109 and the X-sub guide 107 are desirably composed of a nonmagnetic material, such as, for example, nonmagnetic metal or ceramics. On the one hand, the X-guides 106a, 106b and the Y-guide 108 may be composed of a magnetic material because the X-guides and the Y-guide do not affect the varying magnetic field.

Figure 5:
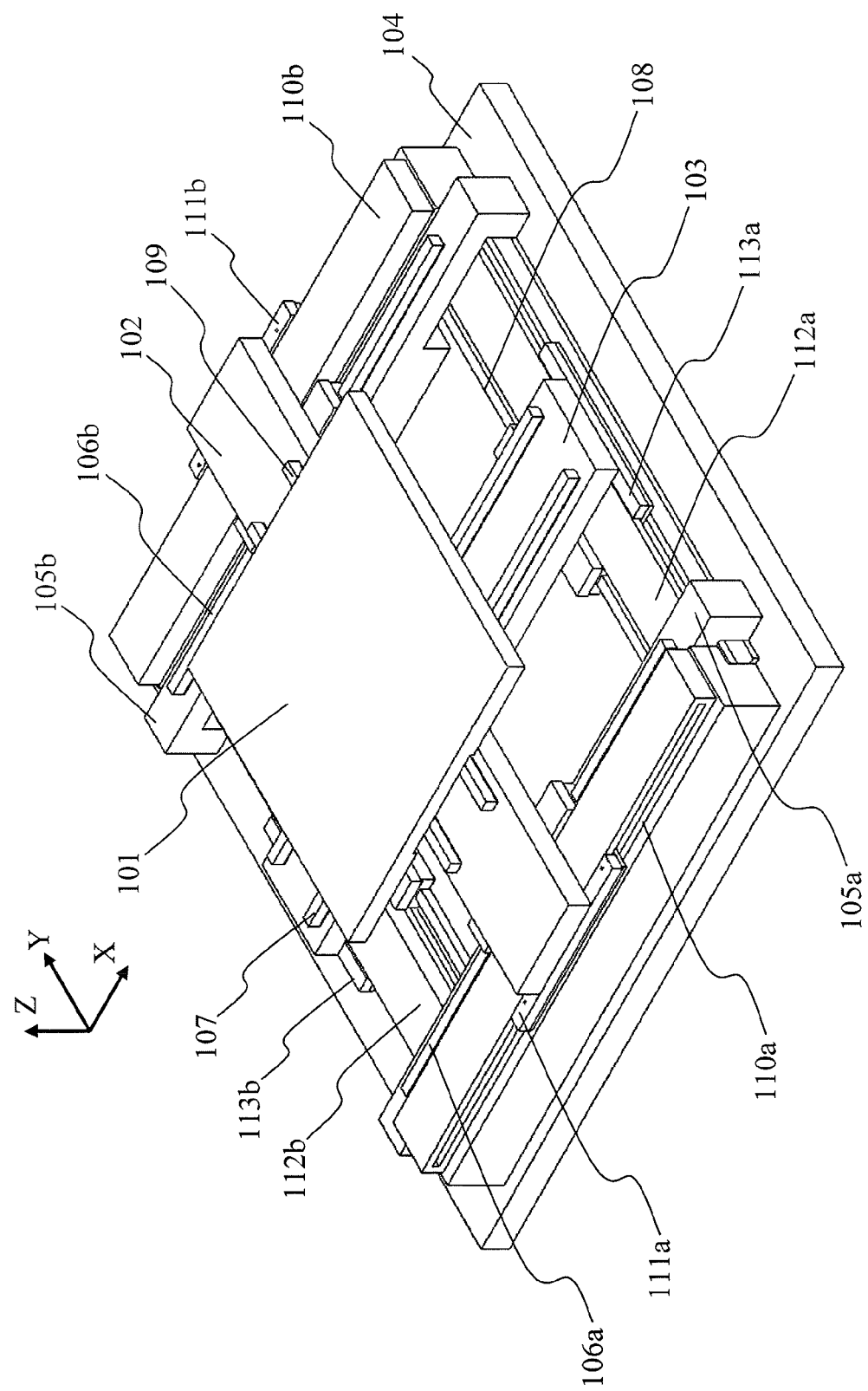
FIG. 5 is an outline sketch drawing illustrating another example of a stage device according to the present invention.

FIG. 5 is an outline sketch drawing illustrating a stage device according to a second embodiment of the present invention. Components of the stage device in this embodiment are similar to those in the first embodiment shown in FIGS. 1 and 2, and, by a like driving method, a top table 101 is driven to operate in two dimensions in the X-Y plane.

In FIG. 5, X-motor stators 110a, 110b are configured to have a "C-shaped" cross section in the Y-Z plane, respectively, to have openings thereof which face outside of a base 104, and further to grasp X-motor movers 111a, 111b by both sides in the Z-direction, respectively. Similarly to the first embodiment, and, by electromagnetic forces generated between the X-motor stators 110a, 110b and the X-motor movers 111a, 111b, respectively, the X-table 102 is driven in the X-direction, respectively.

According to such a configuration, similarly to the Y-motors in the first embodiment described above, the X-motor stators 110a, 110b are also configured to have openings thereof which face outside, thus allowing the direction of a leakage magnetic flux through the openings to be directed outside, and simultaneously, a position at which the magnetic field leaks to be distanced further away from an electron beam. Also, because the motor stators are configured to have the openings thereof which face outside, and to be disposed near the inner wall surfaces of a sample chamber, it becomes effective in further controlling the effect of the magnetic field to apply a magnetic shielding material to the inner wall surfaces of the sample chamber.

Figure 6:
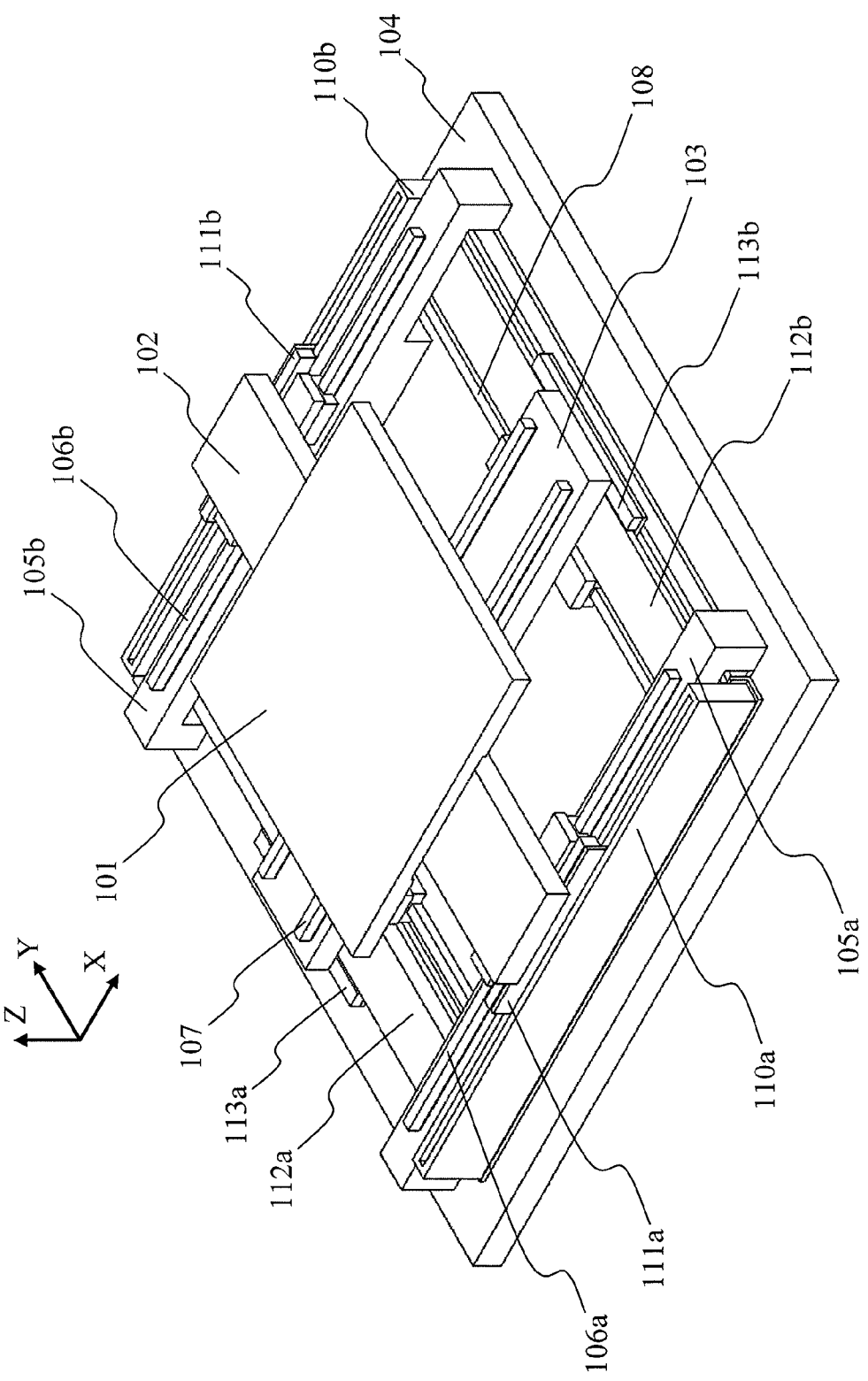
FIG. 6 is an outline sketch drawing illustrating another example of a stage device according to the present invention.

FIG. 6 is an outline sketch drawing illustrating a stage device according to a third embodiment of the present invention. Components of the stage device in this embodiment are mostly similar to those in the first embodiment shown in FIGS. 1 and 2, and, in this embodiment, rather than a Y-sub guide 109, a roller mechanism transmits movement of an X-table 102 in the X-direction to a top table.

Figure 7:
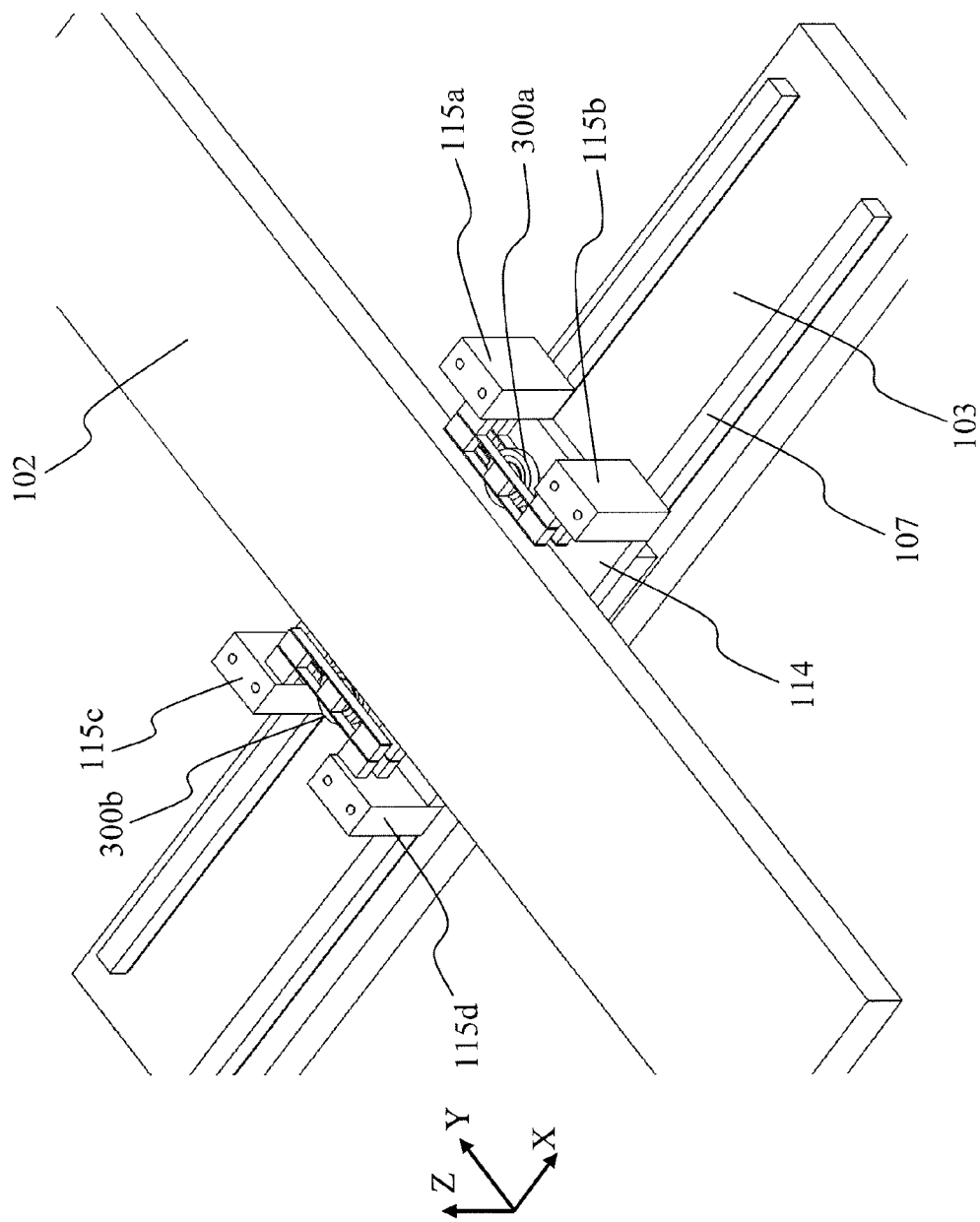
FIG. 7 is an outline sketch drawing illustrating a roller mechanism in the stage device according to the present invention.

FIG. 7 is an outline sketch drawing illustrating the roller mechanism in the stage device shown in FIG. 6. FIG. 7 shows only main components for the sake of description, and the top table 101 is not shown. In FIG. 7, a sub table 114 moves in the Y-direction together with a Y-table 103, and moves along an X-sub guide 107 in the X-direction. The sub table 114 is coupled to the top table 101 (not shown) via four coupling members 115a to 115d. A roller mechanism 300a is provided in the coupling members 115a and 115b disposed on the plus side from the X-table 102 in the X-direction, and similarly a roller mechanism 300b is provided in the coupling members 115c and 115d disposed on the minus side in the X-direction. The roller mechanisms 300a, 300b grasp the X-table 102 by the both side surfaces of the X-table 102, respectively.

Figure 8:
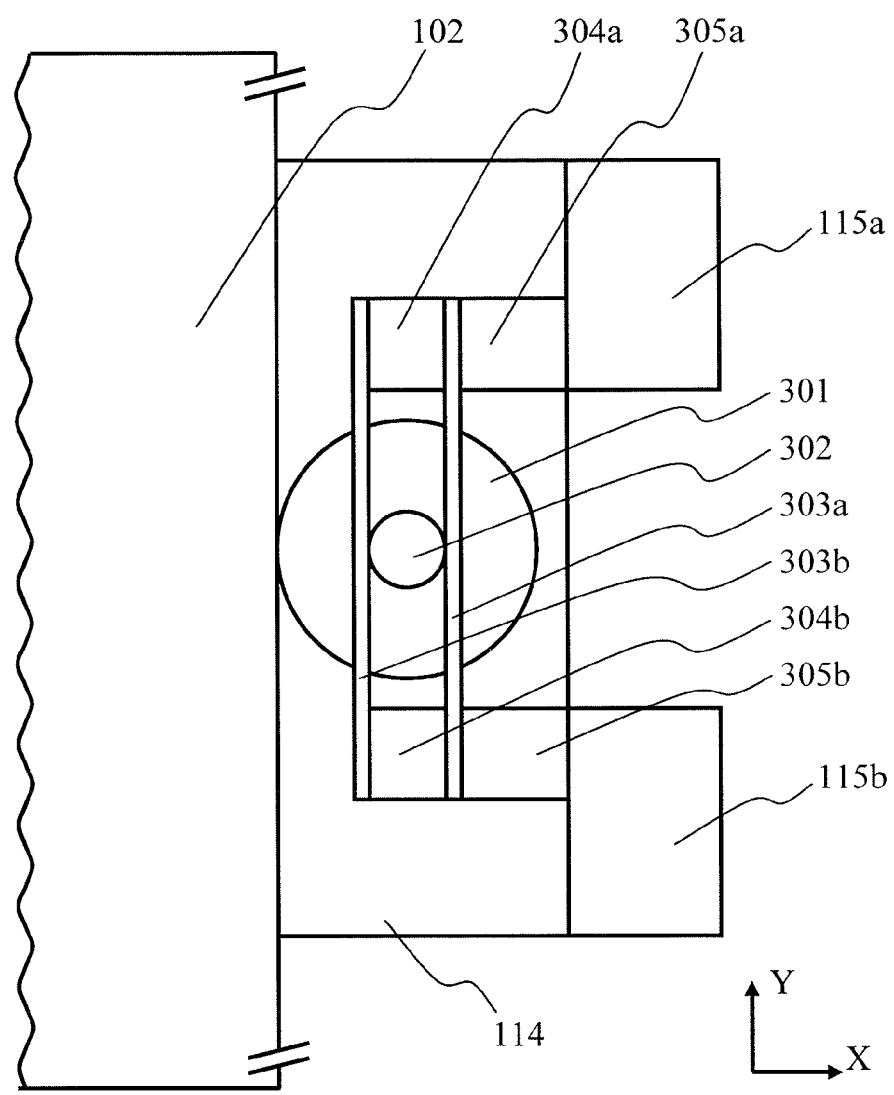
FIG. 8 is a schematic block diagram illustrating the roller mechanism in the stage device according to the present invention.

FIG. 8 is a top view roughly illustrating a configuration of the roller mechanism. FIG. 8 shows only the roller mechanism 300a and main components around it shown in FIG. 7, for the sake of description. In FIG. 8, a roller 301 is rotatably supported by a roller axis 302, which is supported by two leaf springs 303a, 303b. The both ends of the leaf springs 303a, 303b are fixed on the coupling members 115a, 115b, respectively, by support members 304a, 304b and 305a, 305b, respectively.

According to such a configuration, when the sub table 114 moves in the Y-direction, then the roller 301 rotates and moves along the side surface of the X-table 102, and accordingly the top table 101 coupled via the sub table 114 and the coupling members 115a to 115d can freely move in the Y-direction. Also, when the X-table 102 moves in the X-direction, a force is applied to the coupling members 115a to 115d through the roller 301 and the leaf springs 303a, 303b. Thus, the top table 101 coupled to the coupling members 115a to 115d moves in the X-direction.

Here, if the leaf springs 303a, 303b have a low spring stiffness, then looseness, or a dead band may be generated when the X-table 102 moves. Accordingly, it is necessary to select a higher spring stiffness for the leaf springs 303a, 303b, and to provide a pre-compression in the direction of the X-table 102. Then, the support members 304a, 304b and 305a, 305b are desirably configured to have a structure capable of adjusting this pre-compression applied to the leaf springs 303a, 303b. Thus, by designing the spring stiffness and the pre-compression of the leaf springs 303a, 303b, the stiffness of the top table 101 in the X-direction can be designed.

Also, the components of the roller mechanisms 300a, 300b described above are desirably composed of a nonmagnetic material. Accordingly, it is possible to eliminate the variation in magnetic field at the electron beam projection position generated due to a displacement of a magnetic body when the X-table 102 moves.

In this embodiment, the roller mechanisms 300a, 300b are configured to include the roller 301 and the roller axis 302, but the roller mechanisms 300a, 300b can be also effectively configured to include bearing parts such as a ball or a roller. In doing so, a desirable bearing part is usable in a vacuum environment and composed of a nonmagnetic material.

In this embodiment, the X-table 102 is configured to include one roller mechanism on each side surface thereof, but the X-table 102 can be also configured to include two roller mechanisms on each side surface thereof. In doing so, the four coupling members 115a to 115d are desirably configured so that each of the four coupling members can include one roller mechanism and the spring stiffness and the pre-compression of the four roller mechanisms can be designed independently of each other.

In this embodiment, the leaf springs are configured to be fixed to the coupling members, but the leaf springs may be configured to be fixed to the top table.

In this embodiment, instead of the Y-sub guide 109 on the X-table 102, the roller mechanisms 300a, 300b are used, and, similarly, instead of the X-sub guide 107 on the Y-table 103, the roller mechanisms may be used.

Moreover, in the embodiment described above, the X-table is driven by the two linear motors and the Y-table is driven by the two linear motors, but the X-table and the Y-table may be driven by one linear motor, respectively.

Also, in the embodiment described above, the linear motor is configured to include the coil as the mover and the permanent magnet as the stator, but, in contrast, the linear motor can be also configured to include the permanent magnet as the mover and the coil as the stator. In doing so, it is effective to shield a magnetic field generated by the permanent magnet forming the mover with a shielding material, as described above.

Therefore, the stage device configured as described above allows a smaller and lighter device to be provided and the effect of the magnetic field to be controlled to the minimum.

Figure 9:
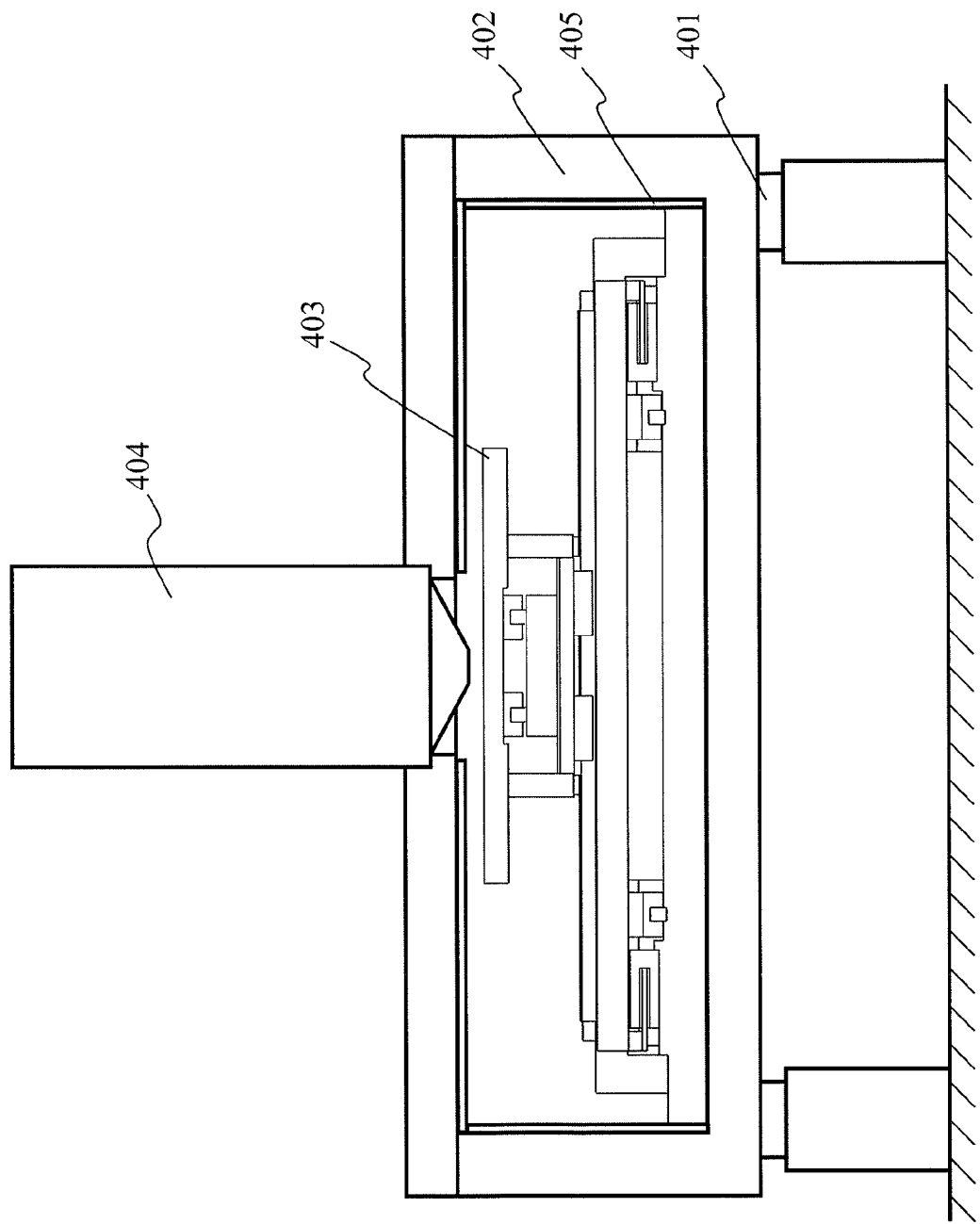
FIG. 9 is a schematic view illustrating a scanning electron microscope incorporating the stage device according to the present invention.

FIG. 9 is a schematic view illustrating a scanning electron microscope including the stage device according to the present invention. This scanning electron microscope includes a sample chamber 402 mounted on a vibration-free mount 401, and inside of the sample chamber, the stage device 403 according to the present invention described above in the first to third embodiments is disposed. In the sample chamber 402, a sample such as a wafer or the like is held and fixed on a stage, and subsequently, the inside of the sample chamber is evacuated. The sample chamber includes, in the upper part thereof, an electron beam source and an optical system for electron beam projection, and a column 404 for projecting and focusing an electron beam on a sample is fixed on the sample chamber. The column projects the electron beam on the sample, and a secondary electron detector detects a secondary electron signal generated from the sample, and the signal is manipulated for image processing, thus producing a two-dimensional image and/or a line profile of the sample. At a position facing toward an opening of a stator in the inner wall of the sample chamber, a magnetic shielding material 405 is applied so as to reduce a leakage magnetic field which leaks through the opening of the stator. It is noted that the stage device of the present invention can be used as a common stage device for a charged particle beam device for projecting an electron beam and/or an ion beam on a held sample, such as a focused ion beam device, in addition to the scanning electron microscope.

REFERENCE SIGNS LIST 101 top table
102 X-table
103 Y-table
104 base
105 X-guide rack
106 X-guide
107 X-sub guide
108 Y-guide
109 Y-sub guide
110 X-motor stator
111 X-motor mover
112 Y-motor stator
113 Y-motor mover
114 sub table
115 coupling member
300 roller mechanism
401 vibration-free mount
402 sample chamber
403 stage device
404 column
405 magnetic shield material

The invention claimed is:
1. A stage device comprising:
a base;
a first table which is guided in a first direction with respect to said base;
a second table which is guided in a second direction orthogonal to said first direction with respect to said base;
a sub table which is guided in said second direction on said first table;
a top table which is guided in said first direction on said second table;
a coupling member for coupling said sub table to said top table;
first drive means for driving said first table in said first direction; and
second drive means for driving said second table in said second direction; wherein
said first drive means and said second drive means move said top table in two dimensions;
said base has a size substantially equivalent to a movable range of said top table which is the sum of a size of said top table and a movable stroke of said top table,
said first drive means comprises a linear motor which is disposed in parallel along said first direction and near an end of said base in said second direction,
said second drive means comprises a linear motor which is disposed in parallel along said second direction and near an end of said base in said first direction,
each of said linear motors comprises a stator having a boxy structure one side of which is open, and a mover moving inside of said stator,
the linear motor forming said first drive means is installed so that the opening of said stator faces outside with respect to said second direction, seen from the center of said base, and
the linear motor forming said second drive means is installed so that the opening of said stator faces upward vertically with respect to said first direction and said second direction.
2. The stage device according to claim 1, wherein:
said first table comprises, on its upper surface, a linear guide for guiding said sub table in said second direction; and
said linear guide is composed of a nonmagnetic material.

3. A stage device comprising:
a base;
a first table which is guided in a first direction with respect to said base;
a second table which is guided in a second direction orthogonal to said first direction with respect to said base;
a sub table which is guided in said second direction on said first table;
a top table which is guided in said first direction on said second table;
a coupling member for coupling said sub table to said top table;
first drive means for driving said first table in said first direction; and
second drive means for driving said second table in said second direction; wherein
said first drive means and said second drive means move said top table in two dimensions;
said base has a size substantially equivalent to a movable range of said top table which is the sum of a size of said top table and a movable stroke of said top table,
said first drive means comprises a linear motor which is disposed in parallel along said first direction and near an end of said base in said second direction,
said second drive means comprises a linear motor which is disposed in parallel along said second direction and near an end of said base in said first direction,
each of said linear motors comprises
a stator having a boxy structure one side of which is open, and
a mover moving inside of said stator;
the linear motor forming said first drive means is installed so that the opening of said stator faces outside with respect to said second direction, seen from the center of said base; and
the linear motor forming said second drive means is installed so that the opening of said stator faces outside with respect to said first direction, seen from the center of said base.
4. The stage device according to claim 1, wherein:
said second table comprises, on its upper surface, a linear guide for guiding said top table in said first direction; and
said linear guide is composed of a nonmagnetic material.
5. The stage device according to claim 1, wherein:
said sub table comprises a pair of roller mechanisms contacting both side surfaces of said second table in said second direction;
each of said roller mechanisms comprises
a roller,
an axis for rotatably supporting said roller,
a spring structure for supporting said axis, and
a mechanism for fixing said spring structure to said top table or said coupling member; and
said roller is pressed against said second table by a pre-compression of said spring structure.
6. A charged particle beam device comprising:
a sample chamber;
a stage device disposed inside of said sample chamber; and
a column for projecting a charged particle beam onto a sample held on said stage device, wherein said stage device is the stage device according to claim 1.
7. The stage device according to claim 3, wherein:
said first table comprises, on its upper surface, a linear guide for guiding said sub table in said second direction; and
said linear guide is composed of a nonmagnetic material.

8. The stage device according to claim 3, wherein:
said second table comprises, on its upper surface, a linear guide for guiding said top table in said first direction; and
said linear guide is composed of a nonmagnetic material.

9. The stage device according to claim 3, wherein:
said sub table comprises a pair of roller mechanisms contacting both side surfaces of said second table in said second direction;
each of said roller mechanisms comprises
   a roller,
   an axis for rotatably supporting said roller,
   a spring structure for supporting said axis, and
   a mechanism for fixing said spring structure to said top table or said coupling member; and
said roller is pressed against said second table by a pre-compression of said spring structure.

10. A charged particle beam device comprising:
a sample chamber;
a stage device disposed inside of said sample chamber; and
a column for projecting a charged particle beam onto a sample held on said stage device, wherein said stage device is the stage device according to claim 3.

* * * * *